(12) United States Patent
Volkau et al.

(10) Patent No.: US 7,805,001 B2
(45) Date of Patent: Sep. 28, 2010

(54) METHOD AND APPARATUS FOR DETERMINING ASYMMETRY IN AN IMAGE

(75) Inventors: Ihar Volkau, Singapore (SG); Wieslaw Lucjan Nowinski, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 873 days.

(21) Appl. No.: 11/662,177

(22) PCT Filed: Sep. 1, 2005

(86) PCT No.: PCT/SG2005/000302

§ 371 (c)(1), (2), (4) Date: Mar. 8, 2007

(87) PCT Pub. No.: WO2006/028416

PCT Pub. Date: Mar. 16, 2006

(65) Prior Publication Data
US 2008/0095419 A1 Apr. 24, 2008

(30) Foreign Application Priority Data
Sep. 10, 2004 (SG) .............................. 200405043-1

(51) Int. Cl.
*G06K 9/00* (2006.01)
(52) U.S. Cl. ..................................... 382/168
(58) Field of Classification Search ................ 382/182, 382/131, 132, 168, 219; 378/21; 128/922; 600/407; 250/252.1, 282; 702/32, 179–181
See application file for complete search history.

(56) References Cited

U.S. PATENT DOCUMENTS 7,274,810 B2 * 9/2007 Reeves et al. ............... 382/128
7,298,881 B2 * 11/2007 Giger et al. ................. 382/128
7,610,082 B2 * 10/2009 Chance ....................... 600/475

OTHER PUBLICATIONS

Z. Wang et al., "Rapid and Automatic Detection of Brain Tumors in MR Images", Proc. of the SPIE, vol. 5369, Medical Imaging 2004: Physiology, Function, and Structure from Medical Images, pp. 602-612, Apr. 2004.

(Continued)

*Primary Examiner*—Jose L Couso
(74) *Attorney, Agent, or Firm*—Dickstein Shapiro LLP

(57) ABSTRACT

A method for determining asymmetry in an image such as an MR image of a brain comprises determining a symmetry plane to divide the image into a first part and a second part representative of, for example, the hemispheres of the brain. The probability distributions of voxels against intensities are determined for the first and second parts and histograms of intensities representative of the parts are generated. Compensation is made for any relative shift along a predetermined axis between the histograms. A divergence value based on a distance between the first and second histograms is then calculated and it is determined if the calculated divergence value is greater than a predetermined threshold. A divergence of greater than the predetermined threshold is indicative of asymmetry in the image that may be considered as suspicious for abnormality. There is also disclosed an apparatus for determining asymmetry in an image.

12 Claims, 13 Drawing Sheets

OTHER PUBLICATIONS

G.E. Christensen et al., "Deformable Templates Using Large Deformation Kinematics," IEEE Transactions on Image Processing, vol. 5, No. 10, Oct. 10, 1996, pp. 1435-1447.

R.P. Velthuizen, "Validity of Guided Clustering for Brain Tumor Segmentation", Engineering in Medicine and Biology Society, 1995, IEEE 17th Annual Conference, V. 1, 1995, pp. 413-414.

O. Yoon et al., "MR Brain Image Segmentation Using Fuzzy Clustering", IEEE International Fuzzy Systems Conference Proceedings, 1999, FUZZ-IEEE '99, vol. 2, pp. 853-857.

A.S. Capelle et al., "Unsupervised Segmentation For Automatic Detection Of Brain Tumours In MRI," Proceedings of International Conference on Image Processing IPMI 2000, V. 1, 2000, pp. 613-616.

C. Li et al., "Knowledge-Based Classification and Tissue Labeling of MR Images of Human Brain," IEEE Transactions on Medical Imaging, vol. 12, No. 4, Dec. 1993, pp. 740-750.

S. Joshi et al., "Structural and Radiometric Asymmetry in Brain Images", *Medical Image Analysis Journal*, vol. 7(2), pp. 155-170 (June 2003).

O. Yoon et al., "MR Brain Image Segmentation Using Fuzzy Clustering", *1999 IEEE International Fuzzy Systems Conference Proceedings*, Aug. 22-25, 1999, pp. 853-857.

P.M. Thompson et al., "Cortical Variability and Asymmetry in Normal Aging and Alzheimer's Disease", *Cerebral Cortex*, Sep. 1998, vol. 8, pp. 492-509.

* cited by examiner

Figure 3
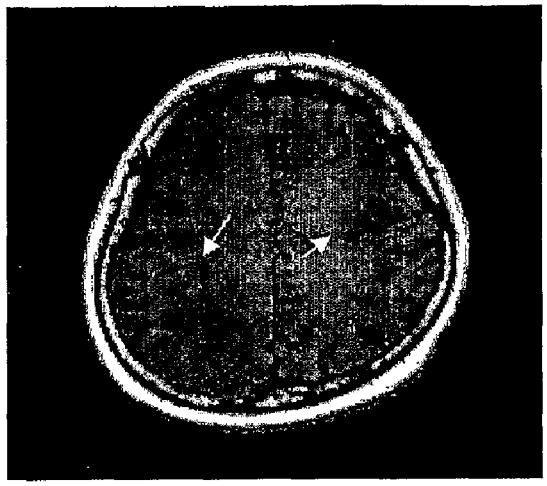
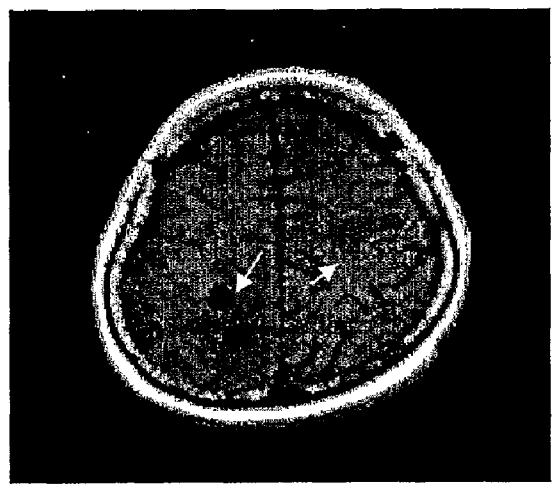
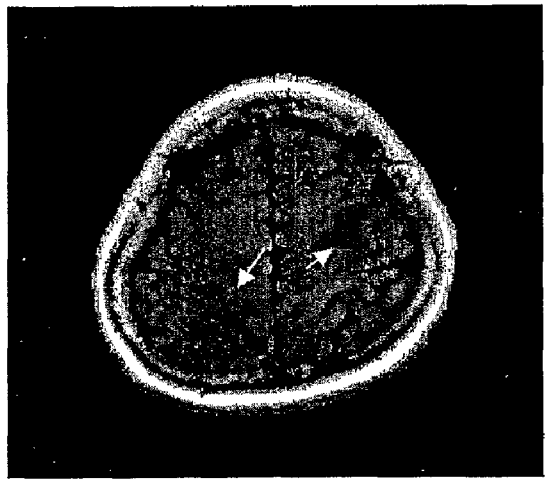

Figure 8
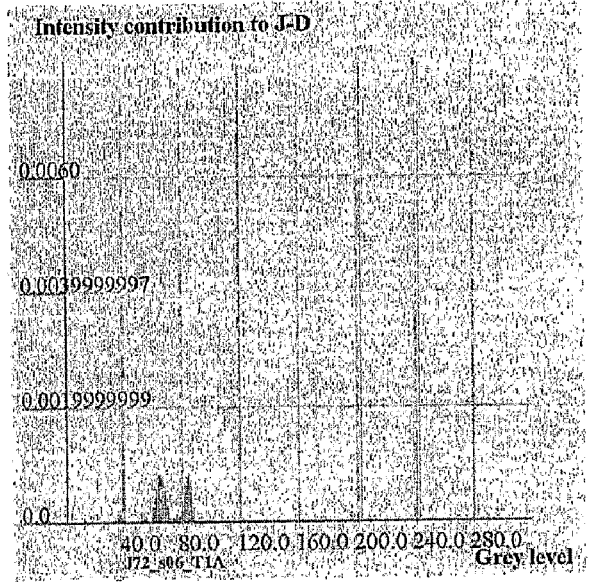
| Figure 9a | Figure 9b | Figure 9c |
|---|---|---|
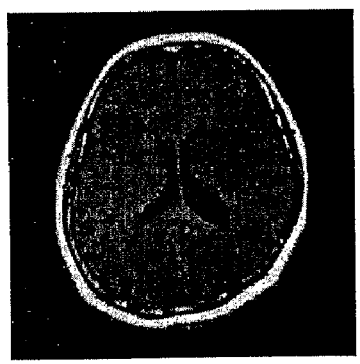  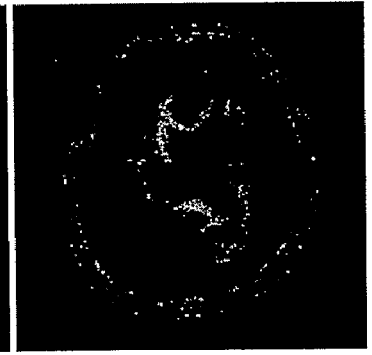
(c0) slice 9     (c1) slice 9 roi62_68     (c2) slice 9 roi82_87
| Figure 10a | Figure 10b | Figure 10c |
|---|---|---|
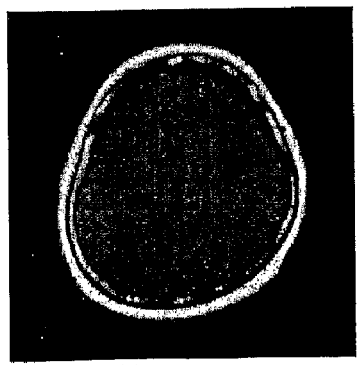  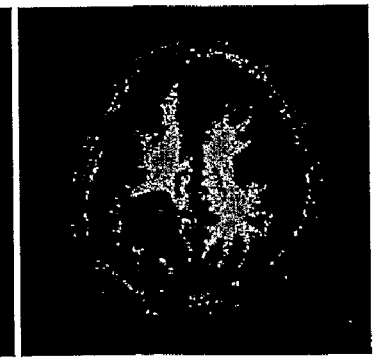
(e0) slice 11     (e1) slice 11 roi62_68     (e2) slice 11

(f0) slice 12

(f1) slice 12 roi62_68

(f2) slice 12

(g0) slice 13

(g1) slice 13 roi62_68

(g2) slice 13

METHOD AND APPARATUS FOR DETERMINING ASYMMETRY IN AN IMAGE

FIELD OF THE INVENTION

The present invention relates to a method and apparatus for determining asymmetry in an image. In particular, the present invention relates to an apparatus and method for determining asymmetry in an image such as a magnetic resonance imaging (MRI) image of, for example, a brain.

BACKGROUND OF THE INVENTION

There are a number of conventional methods for detecting abnormalities in a brain from a study of neuroimages, such as those obtained using magnetic resonance imaging (MRI) techniques. One conventional method is based on the analysis of tissue classes and another conventional method is based on the analysis of the symmetry between the two hemispheres of the brain by, for example, extracting structures, or finding point-to-point inter-hemispheric correspondence and cross-correlation.

A number of papers have been published describing the analysis of tissue classes, for example, the paper entitled Validity Of Guided Clustering For Brain Tumour Segmentation, by Velthuizen, R. P., published by the Engineering in Medicine and Biology Society, 1995, IEEE 17th Annual Conference, V. 1, 1995, 413-414. In this paper, a method is described which detects abnormalities in the brain by allowing the validity of small classes, like tumours, to have a noticeable effect on the validity measure. However, only three tumour data sets, and no normal data sets were tested and reported in this publication.

Unsupervised Segmentation For Automatic Detection Of Brain Tumours In MRI, by Capelle A. S., Alata O., Fernandez C., Lefevre S., Ferrie J. C., published as Proceedings of International Conference on Image Processing IPMI 2000, V. 1, 2000, 613-616 describes a multiple resolution segmentation method in which the brain is divided into homogeneous Gaussian distributed classes. In this method, the maximum a posteriori method is used to estimate the parameters of each class to detect the existence of tumours in a two-dimensional MR image. This method is based on the segmentation of tumours using knowledge of the intensity distribution. However, due to the overlapping intensity of tumour(s) with other normal tissues, this method may segment the tissues incorrectly. This iterative method may also be time consuming although no indication is given in this paper of the run time.

A number of papers have been published describing the analysis of the symmetry between the two hemispheres of the brain. Human brains exhibit an approximate bilateral symmetry with respect to the inter-hemispheric (longitudinal) fissure bisecting the brain, known as the mid-saggital plane (MSP). These methods are based on the assumption that a healthy human brain is roughly symmetrical and an abnormality may be detected from brain asymmetry. A common way of detecting abnormalities using such a method is to consider local geometrical asymmetries, such as changes in the relative shape and structure of the hemispheres. Such a method is described in the paper entitled Cortical Variability and Asymmetry in Normal Ageing and Alzheimer's Disease, by Thompson P M, Moussai J, Zohoori S, Goldkorn A, Khan A A, Mega M S, Small G W, Cummings J L, Toga A W which was published in Cereb. Cortex. 1998 September; 8(6):492-509].

In a paper entitled Knowledge-based Classification And Tissue Labelling Of MR Images Of Human Brain Medical Imaging, by Chunlin Li; Goldgof, D. B.; Hall, L. O. which was published in IEEE Transactions, 1993, Vol. 12(4), 740-750, it is suggested that, using a knowledge based approach involving an estimation of the symmetry of cerebro-spinal fluid (CSF), a tumour can be detected only in the slices containing CSF. The measures used are based strictly on predefined intensity thresholds which can vary from one data set to another. It was assumed that the tumors appear to have intensity higher than that of grey matter on T2-weighted images.

A development of the knowledge-based approach described in the above-mentioned paper was published in a paper entitled MR Brain Image Segmentation Using Fuzzy Clustering, by Ock-Kyung Yoon; Dong-Min Kwak, Dong-Whee Kim, KilHoum Park and published as IEEE International Fuzzy Systems Conference Proceedings, 1999, FUZZ-IEEE '99, Volume: 2, 853-857. In this paper a method is described where fuzzy c-means are used in slices containing CSF to separate grey matter, white matter, and CSF in the cerebrum. In this method, a symmetrical measure based on the number of pixels, moment invariants, and Fourier descriptors is described as being used to quantify the normality of image slices of the brain being studied. However, this algorithm has a number of disadvantages, for example, the quantification of normality is based only on 40 slices in 1 normal and 2 abnormal T2-weighted studies, also, as the symmetrical measure uses a large number of user defined parameters, which are difficult to estimate.

In the publication by Joshi S, Lorenzen P, Gerig G, Bullitt E. entitled Structural and radiometric asymmetry in brain images, Med Image Anal. 2003 June; 7(2):155-170, structural and radiometric asymmetry was analysed through large deformation image warping in three dimensions. Nine tumour and four normal cases were tested, however, there is no information given on the running time. The second stage of the algorithm described in this paper is based on a Christensen warping algorithm which has an extremely long run time and is described in the paper by Christensen G E, R D Rabbit, M I Miller entitled Deformable Templates Using Large Deformation Kinematics, IEEE Transactions on Image Processing, 5(10), 1996, pp. 1435-1447.

All the conventional methods mentioned above, with the exception of that described in the publication by Joshi S, Lorenzen P, Gerig G, Bullitt E. entitled Structural and radiometric asymmetry in brain images, Med Image Anal. 2003 June; 7(2):155-170, work in two dimensions.

SUMMARY OF THE INVENTION

In general terms, the present invention proposes the determination of asymmetry in an image by using an informational divergence measure to calculate the similarity between two parts of the image.

Preferably, embodiments of the invention provide a fast and accurate technique for detecting and locating abnormalities in images, such as MR images on the basis of an analysis of symmetry, and for providing the number of pathological sites in the volumetric image being studied.

The present invention has many applications, for example in the field of neuroimaging, and in the study of pathologies displayed in MR images.

According to a first aspect of the present invention there is provided a method for determining asymmetry in a volumetric image the method comprising the steps of:

determining a symmetry plane to divide the image into a first part and a second part;

determining probability distributions of voxels against intensity for the first part and the second part;

generating a first histogram of intensities representative of the first part;

generating a second histogram of intensities representative of the second part;

compensating for any relative shift along a predetermined axis between the first histogram and the second histogram;

calculating a divergence value based on distance between the first and second histograms; and determining if the calculated divergence value is greater than a predetermined threshold, a divergence of greater than the predetermined threshold being indicative of asymmetry in the image and indicative of one or more abnormalities.

For the purposes of the present specification, the term volumetric image is hereinafter referred to as 'image'.

According to a second aspect of the invention there is provided an apparatus arranged to perform a method for determining asymmetry in an image according to the method defined above.

According to a third aspect of the invention there is provided a computer program product comprising:

a computer usable medium having a computer readable code and computer readable system code embodied on said medium for determining a symmetry plane to divide the image into a first part and a second part; said computer program product further comprising:

computer readable code within said computer usable medium for:

determining probability distributions of voxels against intensity for the first part and the second part;

generating a first histogram of intensities representative of the first part;

generating a second histogram of intensities representative of the second part;

compensating for any relative shift along a predetermined axis between the first histogram and the second histogram;

calculating a divergence value based on distance between the first and second histograms; and determining if the calculated divergence value is greater than a predetermined threshold, a divergence of greater than the predetermined threshold being indicative of asymmetry in the image and indicative of one or more abnormalities.

According to a fourth aspect of the invention there is provided an apparatus for determining asymmetry in an image, the apparatus comprising:

a device for determining a symmetry plane to divide the image into a first part and a second part, that comprise left and right hemispheres respectively;

a device for determining probability distributions of voxels against intensities for the first part and the second part;

a generator for generating a first histogram of intensities representative of the first part and a second histogram of intensities representative of the second part;

a compensator for compensating for any relative shift along a predetermined axis between the first histogram and the second histogram;

a calculator for calculating a divergence value based on distance between the first and second histograms; and a device for determining if the calculated divergence value is greater than a predetermined threshold, a divergence of greater than the predetermined threshold being indicative of asymmetry in the image and indicative of one or more abnormalities.

According to a fifth aspect of the invention there is provided a scanner comprising the apparatus defined above.

BRIEF DESCRIPTION OF THE DRAWINGS

Preferred embodiments of the invention will now be described by way of example and with reference to the accompanying drawings in which:

FIG. 2c is a histogram showing the absolute difference between the pair of histograms of FIG. 2a;

FIG. 3 is a representation of three consecutive MRI slices of a brain showing multiple bilateral asymmetrical brain metastases (SPGR). The tumors are low in intensity with considerable surrounding edema (arrows). The tumor in the right parietal lobe measures 10×10 mm.

FIG. 7b is a histogram showing the absolute difference between two histograms representing the differences between the two hemispheres of the brain illustrated in FIG. 7a;

FIG. 8 is a graph showing the intensity contribution from an MR image of a brain to the J-divergence;

FIG. 9a is an axial slice through the brain MRI of FIG. 8;

FIG. 9b is an MR image of the areas contributing to the first peak shown in the graph of FIG. 8;

FIG. 9c is an MR image of the areas contributing to the second peak shown in the graph of FIG. 8;

FIG. 10a is an MR image of a further axial slice through the brain of FIG. 8;

FIG. 10b is an MR image of the areas contributing to the first peak shown in the graph of FIG. 8;

FIG. 10c is an MR image of the areas contributing to the second peak shown in the graph of FIG. 8;

DETAILED DESCRIPTION OF PREFERRED EMBODIMENTS

In a preferred embodiment, the symmetry of the brain is analysed from the point of view of information theory. If the brain were absolutely symmetrical, the amount of information in both hemispheres would be the same. The brain is usually regarded as being roughly symmetrical. However, brain abnormalities may cause changes in images obtained by MRI techniques. For example, a brain tumors may belong to one or both of the following categories: mass-effect, in which the diseased tissue displaces healthy tissue; and infiltrating, in which healthy tissue has become diseased. Mass-effect brain tumors cause structural asymmetry by displacing healthy tissue, and may cause radiometric asymmetry in adjacent normal structures due to edema. Infiltrating tumors have a different radiometric response from healthy tissue. Both of the categories increase inter-hemisphere asymmetry.

It has been appreciated that by comparing the probability distributions, that is, histograms, of the brain it is possible to determine the value of asymmetry and detect abnormalities.

The brain tissue volume is different from one person to another and the manifestation of brain tissues in MRI also changes from one scanner to another. There are numerous protocols which also influence the nature of an MR image. In view of these factors, normalisation of images with respect to a standard brain structure or structures, or with respect to a particular scanner is difficult. In such situations, self-normalisation of an MR image on the basis of intensity distributions of two hemispheres provides, in some sense, a uniformed representation.

Figure 1:
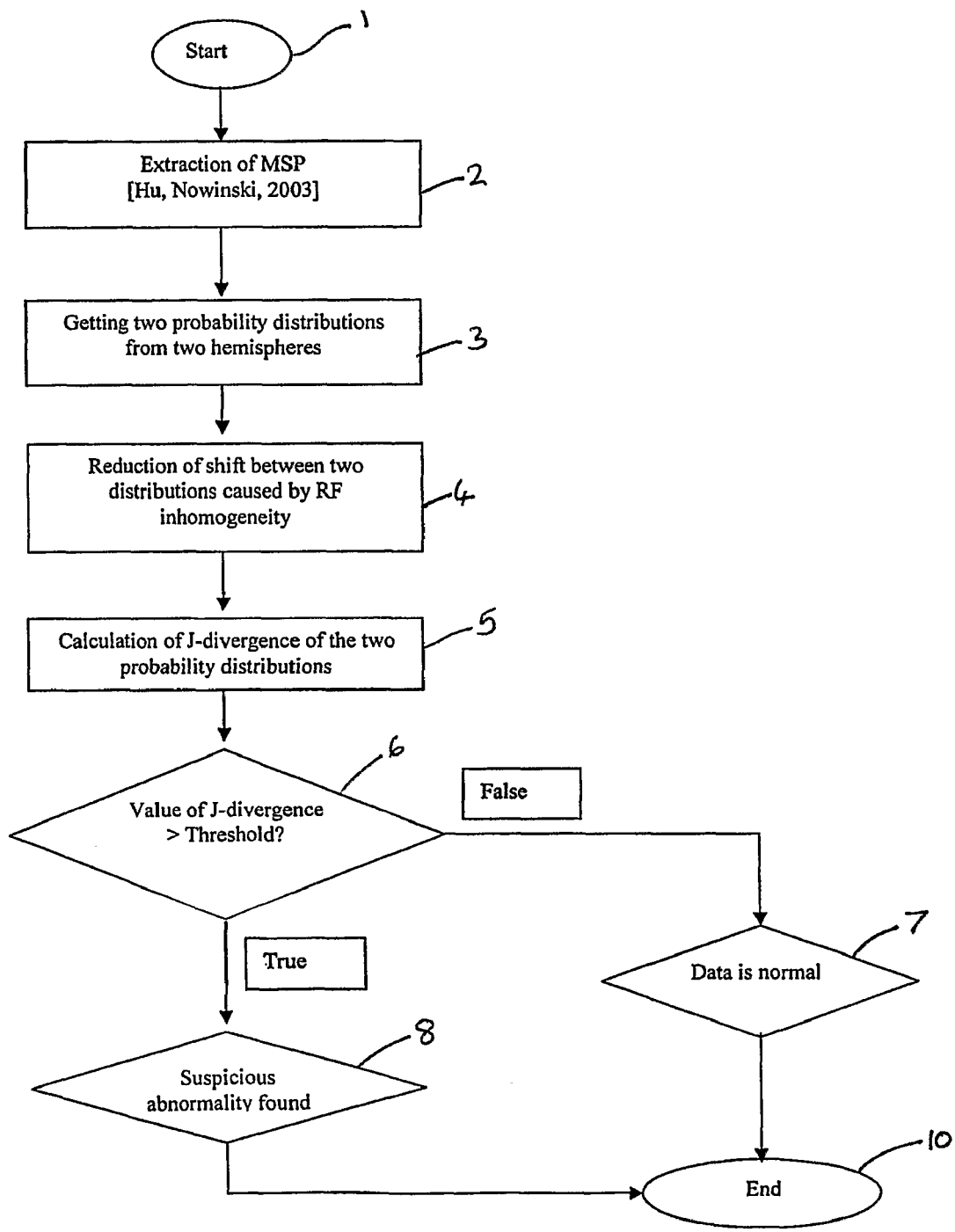
FIG. 1 is a flow diagram showing the process steps in a method according to an embodiment of the invention.

FIG. 1 shows a flow diagram illustrating the steps according to an embodiment of the invention. After obtaining an MRI scan of a brain, the first step 1 is to start the analysis. The next stage 2 in the analysis is to determine the mid-saggital plane (MSP) using, for example, the method described in the paper by Qingmao Hu and Wieslaw L. Nowinski, published by Neuroimage, "A rapid algorithm for robust and automatic extraction of the midsagittal plane of the human cerebrum from neuroimages based on local symmetry and outlier removal", 20(4):2154-2166. This method exploits the extraction of symmetry lines in axial or coronal 2D slices and fitting a 3D plane to the set of data obtained.

Figure 2A:
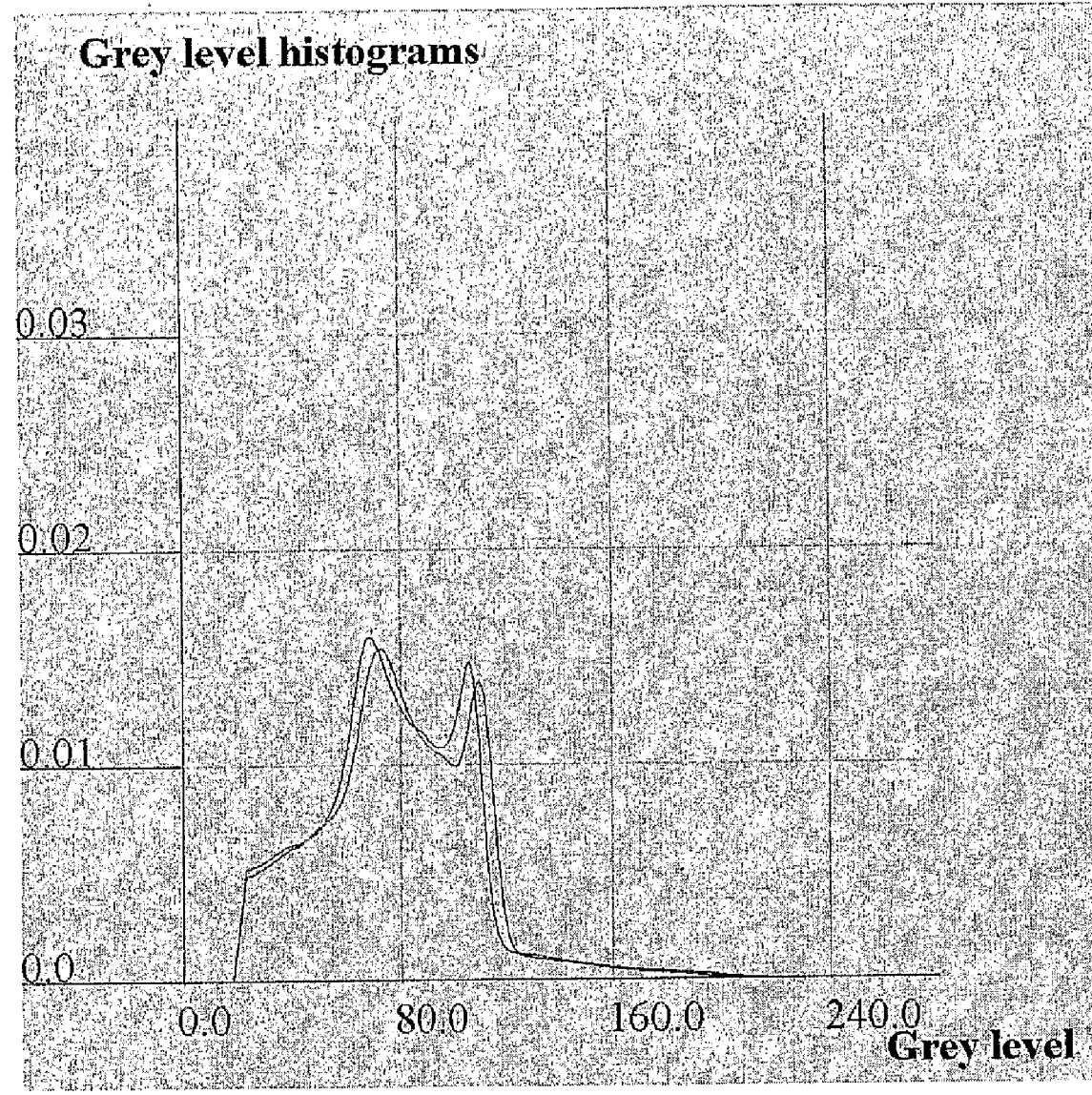
FIG. 2a is a pair of histograms from a normal brain showing the distribution of the number of voxels in an MR image against the grey level.
Figure 2B:
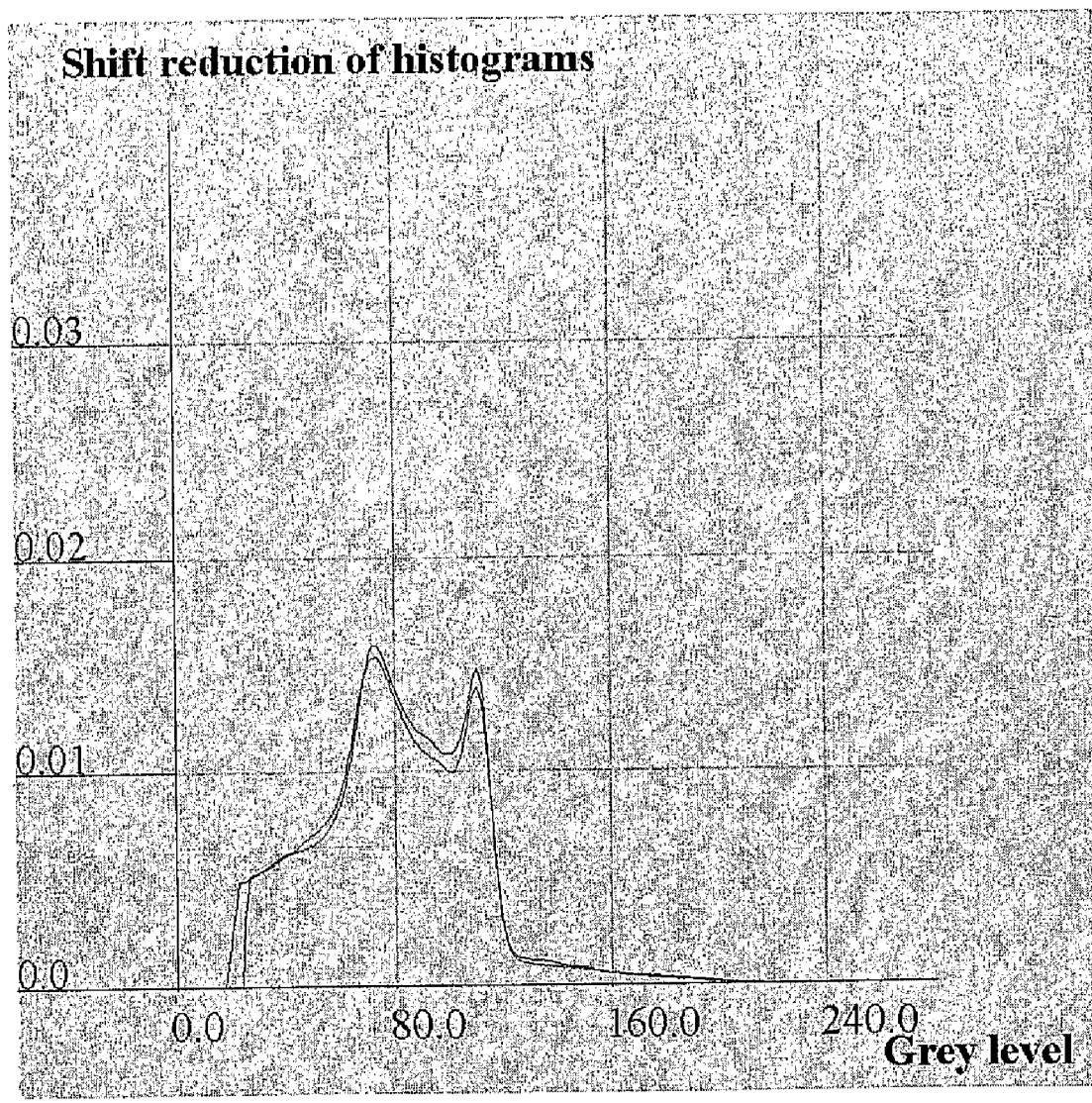
FIG. 2b shows the pair of histograms of FIG. 2a after shift reduction.

The next stage 3 is to divide the MRI volume into the two hemispheres of the brain, the right and left hemispheres being separated by the MSP. The probability distributions of voxels against intensities are then obtained for each hemisphere to create two histograms, one representing the left hemisphere and the other representing the right hemisphere. It has been observed that sometimes these histograms have some shift in the intensity values as shown at FIG. 2a. There was no shift in the studies where head coils were used. The shift was observed in the data obtained from studies using the body coil, which has a higher degree of RF inhomogeneity than the smaller head coil. This shift could be explained by radio-frequency (RF) coil non-uniformity, gradient-driven eddy currents, and patient anatomy both inside and outside the field of view. Empirically this shift is less than 5 grey levels in 8 bit data. We perform shift reduction of original histograms by fixing one histogram and moving the other horizontally in a given range of ±5 grey levels (sufficient for the cases studied). At every relative position of the histograms J-divergence is calculated. Minimum of J-divergence represents the relative position of the two histograms with the least influence of shift. It corresponds to maximum reduction of influence of the RF inhomogeneity and gives us histograms for the left and right parts of the MRI which reflect the real interdependence of intensity distributions. FIG. 2b shows the two histograms of FIG. 2a after shift reduction has been applied as described above.

The next stage 5 in the method embodying the invention, as shown in FIG. 1, is to calculate the J-divergence between the two histograms. J-divergence provides a comparison of the informational content of the intensity distributions in the left and right hemispheres given in the MR image and is a general indication of the distance between distributions for both hemispheres.

The value of the J-divergence is then compared in a further stage 6 with a threshold value. If the value of the J-divergence does not exceed the threshold, the scan is considered in a further stage 7 to be normal and no further action is required. Alternatively, if the value of the J-divergence exceeds the threshold, this is considered in a further stage 8 to be an indication that an abnormality has been found in the scan and the results are then analysed in a still further stage 9 to determine the maximum (principal) summands in the J-divergence and the tissues to which they correspond. These tissues are considered to be the main contributors to the asymmetry. The process then ends in a final stage 10 and the results may then be studied further to determine the nature of the detected abnormality.

Figure 2C:
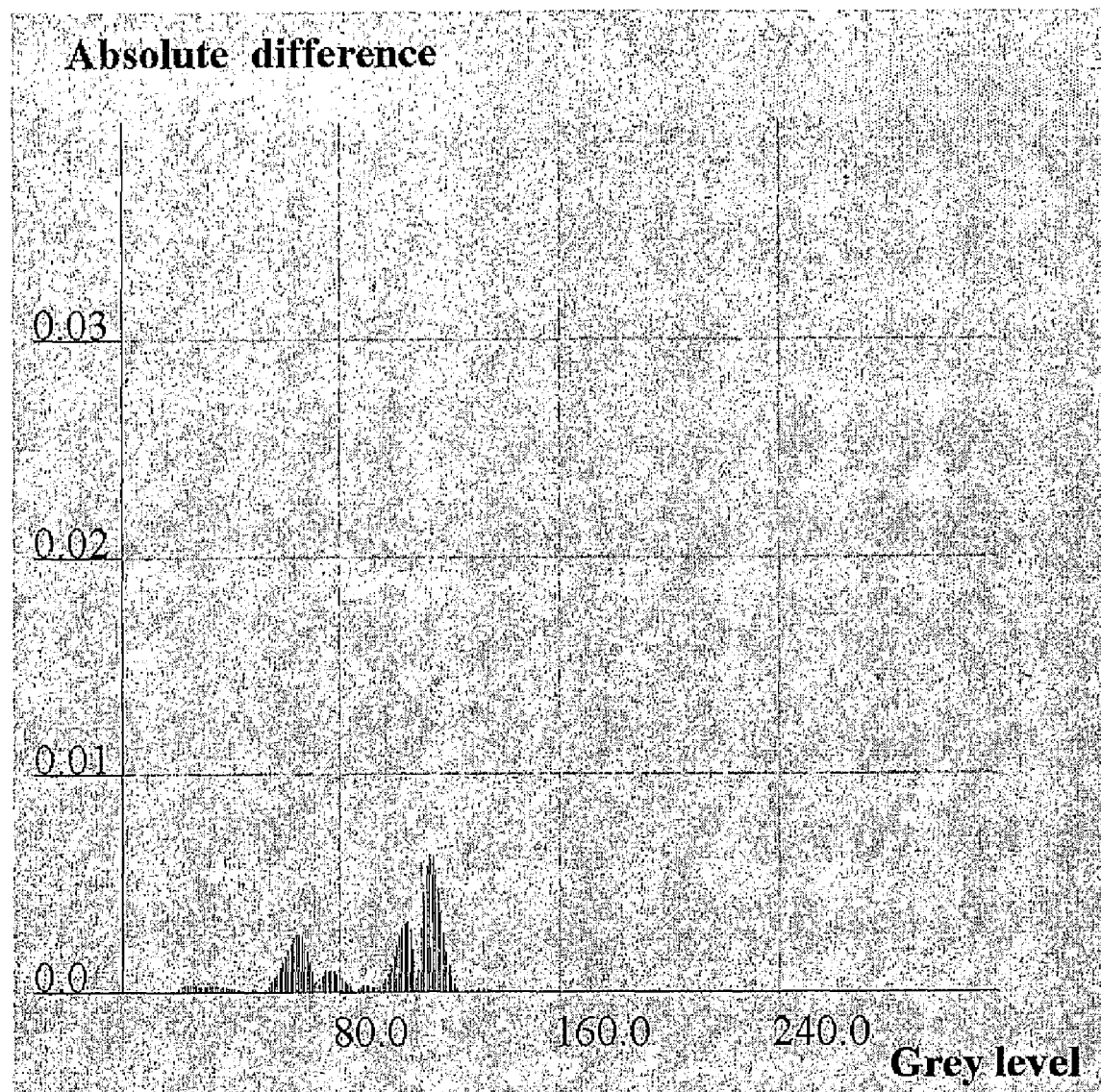
Figure 2D:
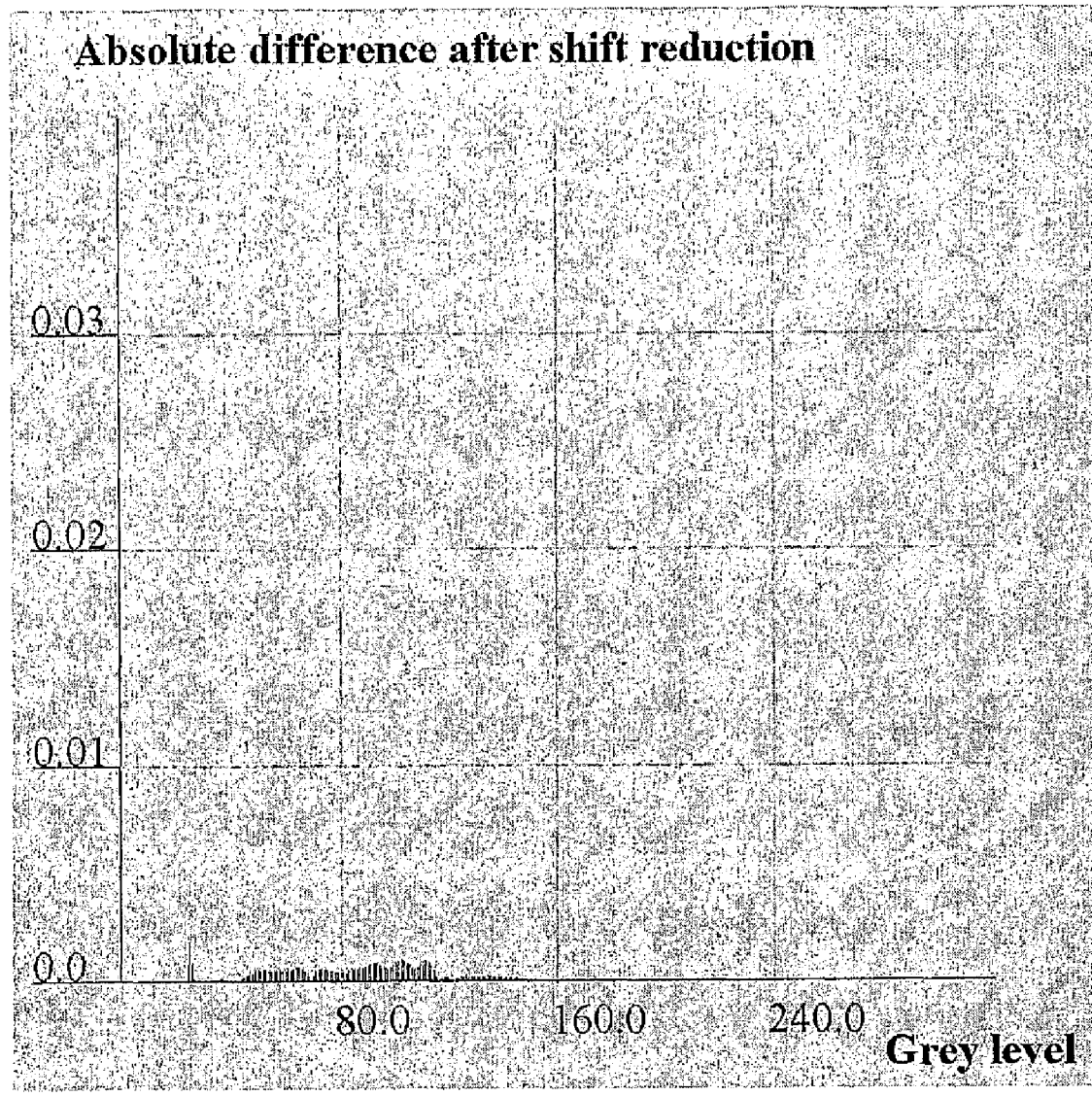
FIG. 2d is a histogram showing the absolute difference between the pair of histograms of FIG. 2b.

FIG. 2a shows the two histograms calculated as corresponding to the left and right hemispheres of the brain being studied. FIG. 2b shows the two histograms of FIG. 2a corrected for shift by fixing one histogram and moving the other horizontally in the range of ±5 grey levels. FIG. 2c shows the absolute difference of the two histograms of FIG. 2a and FIG. 2d shows the absolute difference of the two histograms of FIG. 2b, that is, after shift reduction.

As mentioned above, after shift reduction has been applied to the calculated histograms, at every relative position of the histograms, J-divergence is calculated. The minimum of J-divergence corresponds to a maximum reduction in the influence of the RF inhomogeneity and provides histograms for the left and right parts of the MRI which reflect the real interdependence of the intensity distributions.

The J-divergence may be calculated as follows:

A three-dimensional volumetric image may be considered to be a union of two parts, one part representing the left hemisphere and the other part representing the right hemisphere, the two parts being divided by the MSP. The distributions of values that voxel intensities take on these parts may be considered to be the probability distributions of a discrete random value. These probability distributions may be denoted as $p=\{p_i\}$ and $q=\{q_i\}$, where $p_i$ and $q_i$, are the probabilities of occurrence of the voxel with intensity i in the left and right parts respectively, a voxel being a volume which is the smallest distinguishable box-shaped part of a three-dimensional image.

The quantity $\log(1/p_i)$ is termed 'surprise' or 'unexpectedness'. If $p_i=1$ then an event is certain to happen, and zero surprise is expected if the event does occur. If the event is nearly impossible ($p_i \, 0$), this means that there is infinite surprise if the event does occur. The difference in unexpectedness for these events may be denoted as $(\log(1/p_i)-\log\{1/q_i\})$. Averaging over all the intensities gives a divergence of unexpectedness which may be expressed as:

$$I(p/q) = \sum_i p_i \log(p_i/q_i)$$

The above function I(p/q) is known as the Kullback-Leibler' divergence or the cross-entropy. It gives an information divergence measure between the two probability distributions p and q. In other words, it is a measure of the distance between the distributions. The function I(p/q) is non-negative, and additive but not symmetric.

In the preferred embodiment of the invention, a symmetric measure is used which is termed the J-divergence which may be expressed as:

$$J(p,q)=I(p,q)+I(q,p)$$

This measure provides a comparison of informational contents of intensity distributions in the left and right parts of an MR image of a brain and substantially provides the distance between the distributions for both of the hemispheres.

J-divergence is a sum of I(p,q) and I(q,p). These values depend on the ratio of $p_i$ and $q_i$ but not the values themselves; so J-divergence has a self-normalisation feature, J-divergence may be used in the consideration of MR data with different pulse sequences. The similarity of roughly symmetrical structures may be estimated using the J-divergence as an indication of the measure of similarity of the two distributions.

As mentioned above, abnormalities change the radiometric response of tissues, and this affects the probability distribution, of intensities for the hemispheres so, using J-divergence, it is possible to measure the dissimilarity. By virtue of the roughly symmetrical nature of the brain, the cases with a value of J-divergence measure greater than a predetermined threshold value may be considered as suspicious for abnormality. In a preferred embodiment, the empiric threshold $T_o$ which has been determined to minimise the sum of false negative and false positive (wrong) results is approximately 0.008125.

A study has been conducted comprising the analysis of only the part of brain above eyes, as the inferior part of the head starting from the level of the paranasal sinuses is highly asymmetrical. Detection of the start slice has been carried out manually in the study.

The method embodying the invention was tested on phantom and real data from different sources and comprised 165 studies of 97 patients. In real tumour cases, J-divergence may sometimes detect a tumour with a diameter of as small as about 10 mm. FIG. 3 shows three consecutive MRI slices of a brain showing multiple bilateral asymmetrical brain metastases (SPGR). The tumors are low in intensity with considerable surrounding edema (arrows). The tumor in the right parietal lobe measures 10×10 mm.

In tumour cases a complex of tumour tissue, edema and distortion of neighborhood structures all contribute to the asymmetry of the hemispheres and increase J-divergence.

Out of the 165 studies considered, 55 were healthy patients and 42 were patients with different brain pathologies manifested in MRI. The results of the investigation are shown in Table 1 below.

TABLE 1

| Measures | True positive | False negative | True negative | False positive |
|---|---|---|---|---|
| J divergence (Shift reduced) | 35/42 = 83.33% | 7/42 = 16.7% | 51/55 = 92.72% | 4/55 = 7.27% |

Figure 4:
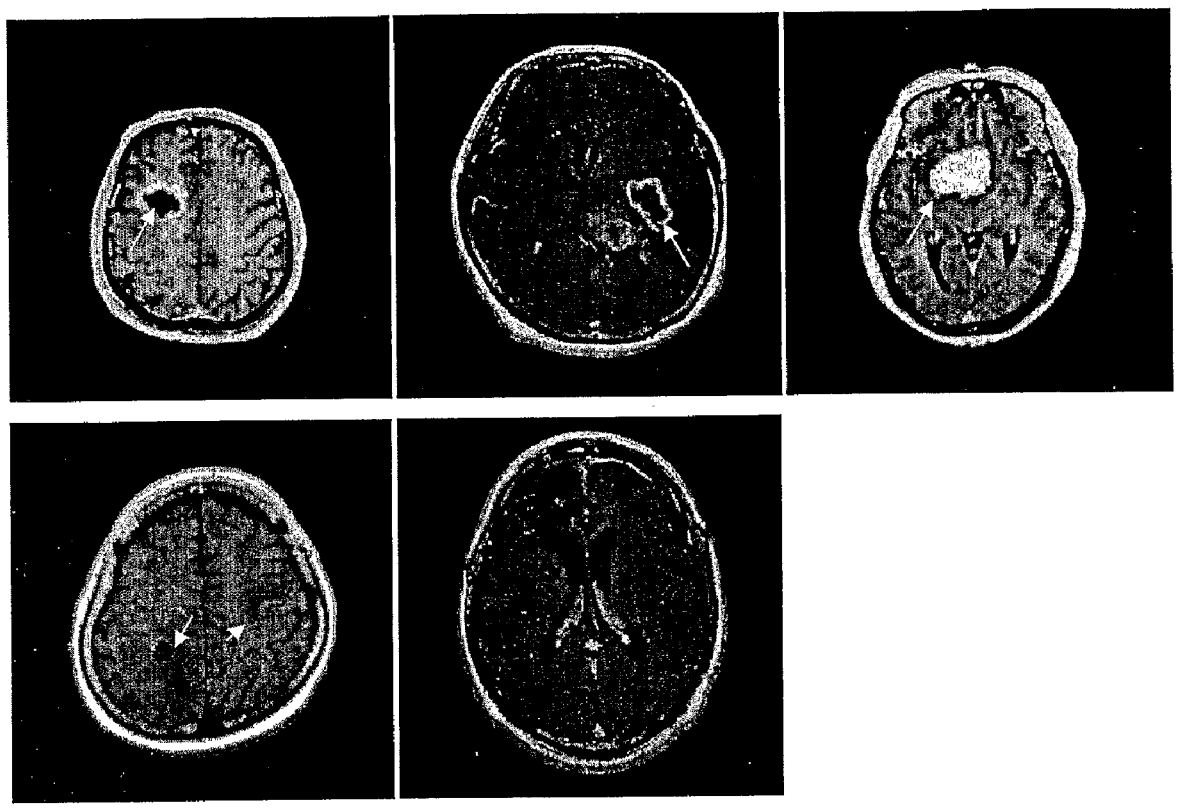
FIG. 4 is a representation of five MRI slices of tumour cases. These are the examples of cases with true positive results in which the abnormalities (arrows) were detected using the J-divergence method.

FIG. 4 shows five MR images of examples of tumour cases where abnormalities (arrows) were correctly detected using the method embodying the invention.

Figure 5:
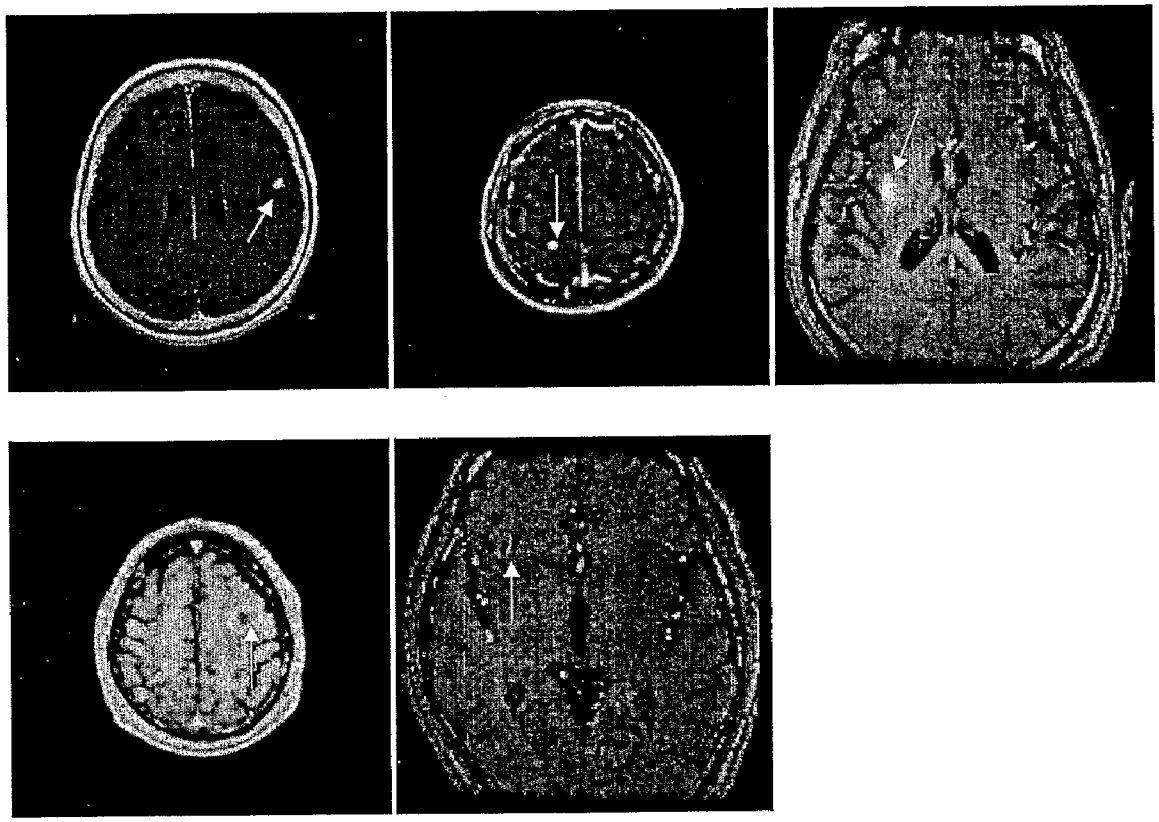
FIG. 5 is a representation of five MRI slices of tumour cases in which the abnormalities (arrows) were too small to show asymmetry and were not detected using the J-divergence method.
Figure 6:
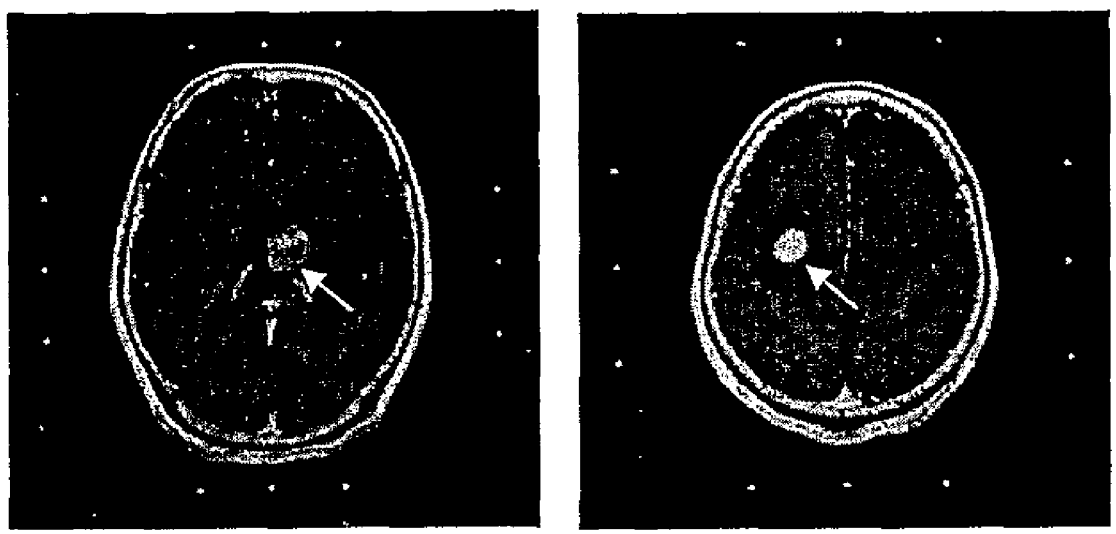
FIG. 6 is a pair of MRI slices of a false negative case in which multiple tumors of similar intensities (as indicated by the arrows) are on both sides of the brain.

FIG. 5 shows five MR images of tumour cases in which the tumours were too small to show asymmetry and FIG. 6 shows a pair of MRI slices of a false negative case in which multiple tumours of similar intensities (as indicated by the arrows) are on both sides of the brain and which therefore manifest in approximately the same way in the probability distributions of both hemispheres.

The values of J-divergence for the 165 studies of different pulse sequences were calculated. All the information on the normality of the data was known a priori. Abnormalities in the brains studied included different types of tumours, neuroma, multiple metastasis, hematoma, meningioma, and hydrocephalus.

Threshold for the separation of normal and abnormal cases is defined empirically. In the study, the empiric threshold $T_o$ which was found to minimise the sum of false negative and false positive (wrong) results is approximately 0.008125.

In Table 2 below, information on the detection of abnormalities using the method embodying the invention and different pulse sequences in the scanner is provided. Table 2 is based on cases, not patients; so if patient has several cases of different pulse sequences and abnormality was detected only for some of the patient's cases, other failed cases have been included in the FN column, even if abnormality were not manifested in the particular case.

TABLE 2

| Cases with detected abnormalities | | | |
|---|---|---|---|
| Modality | Number of cases (108) | Detected correctly TP (77) 71.3% | Detected Incorrectly FN(31) 28.7% |
| Flair | 11 | 11 | 0 |
| PD | 3 | 2 | 1 |
| SPGR | 8 | 3 | 5 |
| SPGR localised | 9 | 4 | 5 |
| T1 | 29 | 23 | 6 |
| T1SECE | 28 | 20 | 8 |
| T2 | 28 | 20 | 8 |

| Cases without detected abnormalities | | | |
|---|---|---|---|
| Modality | Number of cases (61) | Detected correctly TN (56) 91.8 | Detected incorrectly FP(5) 8.2% |
| Flair | 0 | 0 | 0 |
| PD | 3 | 3 | 0 |
| SPGR | 47 | 44 | 3 |
| SPGR localised | 0 | 0 | 0 |
| T1 | 2 | 1 | 1 |
| T1SECE | 0 | 0 | 0 |
| T2 | 8 | 7 | 1 |
| TOF | 1 | 1 | 0 |

The contribution of different intensities to the J-divergence was analysed and the maximum (principal) summands determined. These summands correspond to the tissues which contribute mainly to asymmetry. All non-principal intensities were removed from the image (that is, they were set to black colour).

Figure 7A:
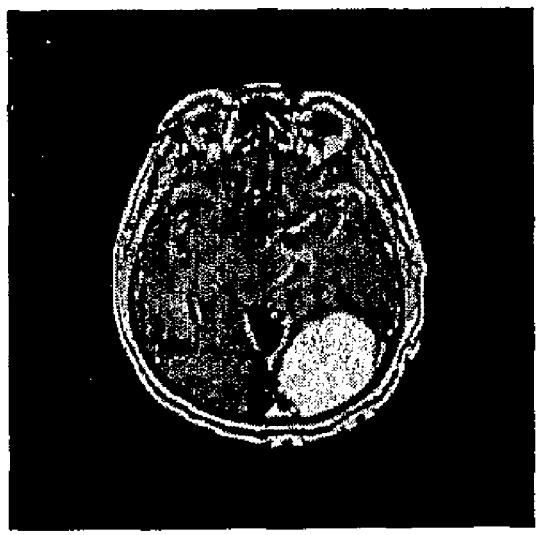
FIG. 7a is an MRI slice showing a large tumour.
Figure 7B:
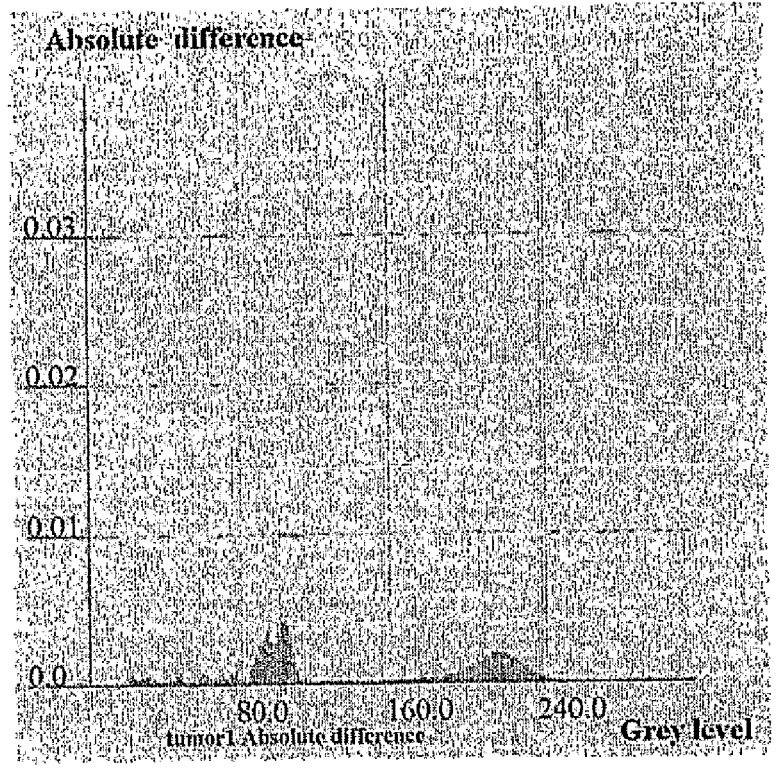
Figure 7C:
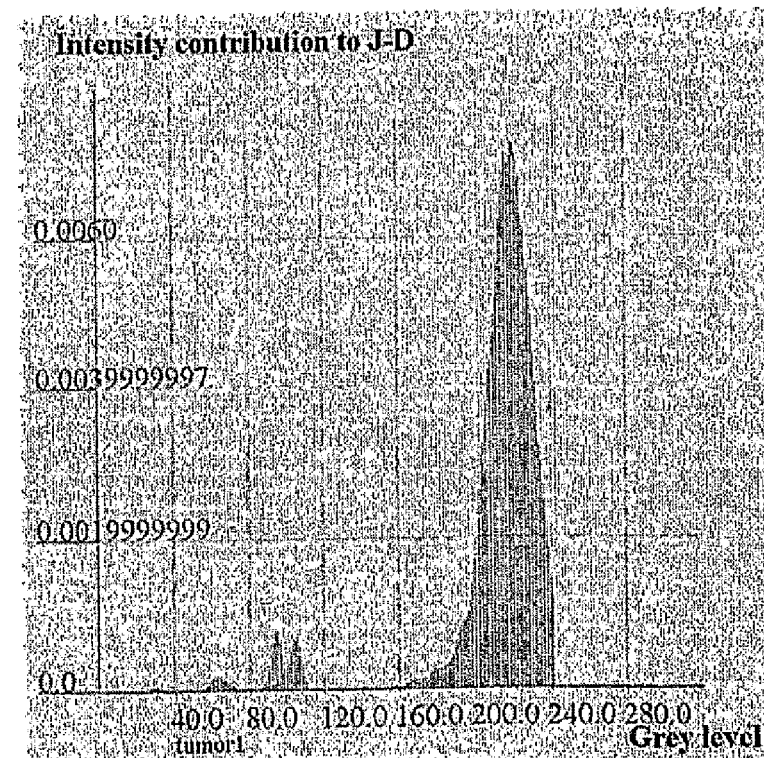
FIG. 7c is a graph showing the intensity contribution of the image of FIG. 7a to the J-divergence.
Figure 7D:
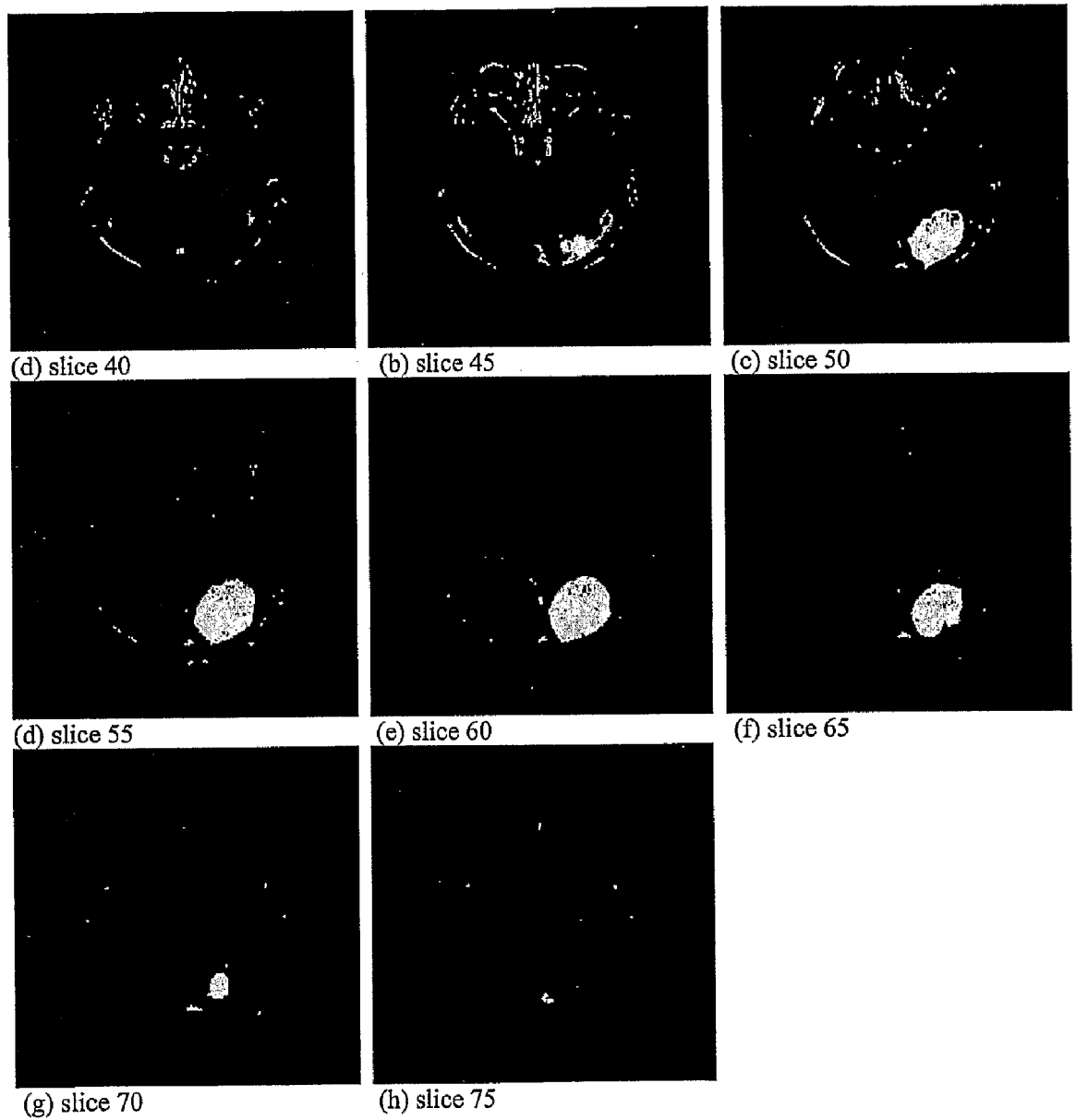
FIG. 7d is a series of MRI axial slices, separated vertically, showing a large tumour.
Figure 11A:
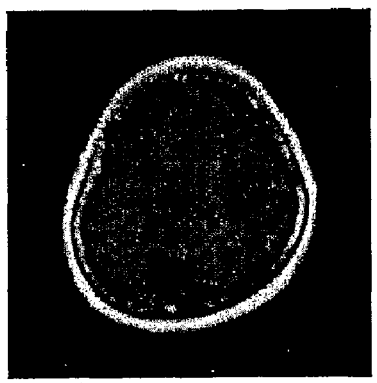
FIG. 11a is an MR image of a still further axial slice through the brain of FIG. 8.
Figure 11B:
FIG. 11b is an MR image of the areas contributing to the first peak shown in the graph of FIG. 8.
Figure 11C:
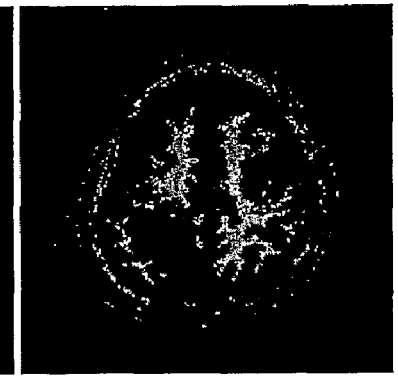
FIG. 11c is an MR image of the areas contributing to the second peak shown in the graph of FIG. 8.
Figure 12A:
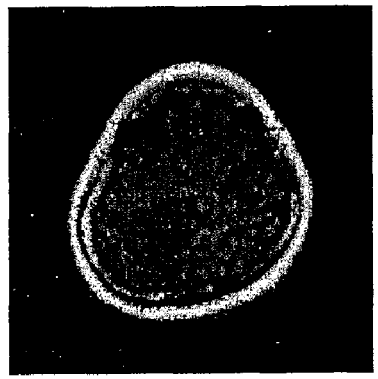
FIG. 12a is an MR image of a further axial slice through the brain of FIG. 8.
Figure 12B:
FIG. 12b is an MR image of the areas contributing to the first peak shown in the graph of FIG. 8.
Figure 12C:
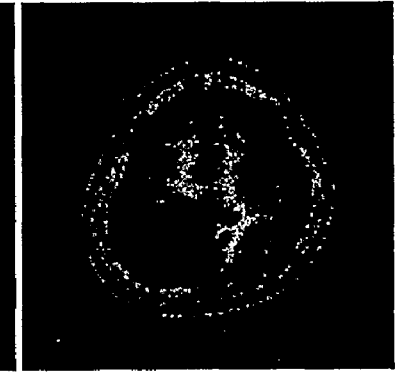
FIG. 12c is an MR image of the areas contributing to the second peak shown in the graph of FIG. 8.

FIG. 7a shows the localisation of a large tumour. FIG. 7b shows the absolute difference between left and right histograms (not shown) generated from the image of FIG. 7a, after shift reduction has been applied. FIG. 7c shows a plot of the intensity contributions of the left and right hemispheres of the brain shown in FIG. 7a to the J-divergence. It will be seen that the plot of FIG. 7c has only one large peak. FIG. 7d is a series of axial slices of the brain of FIG. 7a, moving up towards the crown of the head from which the overall shape and location of the abnormality may be deduced.

FIG. 8 shows a plot of the intensity contributions of the left and right hemispheres of a further brain being studied to the J-divergence.

The scans from the brain of FIG. 8 were considered further and various additional scans were obtained. These are shown in FIGS. 9a to 12c. In each case, the images 9a, 10a, 11a and 12a are the original slice images as obtained from the scanner. The second images, 9b, 10b, 11b and 12b show areas contributing to the first peak in the plot of FIG. 8. The third images show areas corresponding to the second peak in the plot of FIG. 8.

In summary, embodiments of the invention use an informational divergence measure to calculate the similarity of two distributions corresponding to both hemispheres of a brain to estimate brain asymmetry. The embodiments of the invention provide a rapid method for identification and localisation of abnormalities in the cerebrum. Furthermore, the methods embodying the invention are pulse sequence independent Preferred methods embodying the invention provide a technique for detecting and locating abnormalities in the MR images on the basis of an analysis of symmetry.

The present invention has many applications, for example in the field of neuroimaging, and in the study of pathologies displayed in MR images.

Using a Pentium IV, 2.4 GHz processor, RAM 512M, it has been found that it takes less than 3 seconds using a method according to an embodiment of the invention to judge the normality of the data being studied.

It will be appreciated that the scope of the present invention is not restricted to the described embodiments. Numerous other modifications, changes, variations, substitutions and equivalents will therefore occur to those skilled in the art without departing from the spirit and scope of the present invention.

The invention claimed is:

1. A computerized method for determining asymmetry in a medical image, the method comprising the steps of:
   receiving the medical image;
   determining a symmetry plane to divide the image into a first part and a second part, that comprise left and right hemispheres respectively;
   determining probability distributions of voxels against intensities for the first part and the second part;
   generating a first histogram of intensities representative of the first part and storing the first histogram on a computer memory;
   generating a second histogram of intensities representative of the second part and storing the second histogram on the computer memory;
   compensating for any relative shift along a predetermined axis between the first histogram and the second histogram;
   calculating, using a computer processor, a divergence value based on distance between the first and second histograms; and
   determining if the calculated divergence value is greater than a predetermined threshold, a divergence of greater than the predetermined threshold being indicative of asymmetry in the medical image and indicative of one or more abnormalities, wherein the step of calculating, using the computer processor, the divergence value comprises determining probability distributions of intensities for the first part and the second part and calculating the J-divergence value according to the following equation:

$$J(p,q) = I(p,q) + I(q,p)$$

where $I(p/q)$ and $I(q/p)$ are the Kullback-Leibler's divergences for intensity distributions q and p of the first and second parts respectively.

2. The method according to claim 1, wherein the step of compensating comprises moving of the first histogram along said predetermined axis to align said first and second histograms along said axis to receive minimum distance between histograms.

3. The method according to claim 1, wherein the step of determining a symmetry plane comprises determining the mid-saggital plane of an image of a brain.

4. The method of claim 1, wherein the step of determining if the calculated divergence value is greater than a predetermined threshold, comprises comparing said divergence value with a threshold value of around 0.008125.

5. The method of claim 1, further comprising the step of determining one or more maximum (principal) summands in the calculated divergence value and any tissues to which the summands correspond in the image being studied, the summands being indicative of main contributors to asymmetry between the first and second parts.

6. The method of claim 5, further comprising displaying the principal summands and any corresponding tissues to facilitate the location of the asymmetry.

7. The method of claim 1, wherein any one or more of the method steps may be implemented using software and/or hardware.

8. The method of claim 1, wherein the step of determining a symmetry plane to divide the image into a first part and a second part comprises determining a symmetry plane to divide the image into a first part representative of a first hemisphere of a brain and a second part representative of a second hemisphere of the brain.

9. A method for determining asymmetry in a magnetic resonance image (MRI) comprising the method of claim 1.

10. An apparatus arranged to perform a method for determining asymmetry in an image according to claim 1.

11. A computer program product comprising:
   a non-transitory computer readable medium having a computer readable code and computer readable system code embodied on said medium for determining a symmetry plane to divide the image into a first part and a second part; that comprise left and right hemispheres respectively, said computer program product further comprising:
   computer readable code within said computer usable medium for:
   determining probability distributions of voxels against intensities for the first part and the second part;
   generating a first histogram of intensities representative of the first part;
   generating a second histogram of intensities representative of the second part;
   compensating for any relative shift along a predetermined axis between the first histogram and the second histogram;
   calculating a divergence value based on distance between the first and second histograms; and determining if the calculated divergence value is greater than a predetermined threshold, a divergence of greater than the predetermined threshold being indicative of asymmetry in the image and indicative of one or more abnormalities, wherein the step of calculating the divergence value comprises determining probability distributions of intensities for the first part and the second part and calculating the J-divergence value according to the following equation:

$$J(p,q)=I(p,q)+I(q,p)$$

where $I(p/q)$ and $I(q/p)$ are the Kullback-Leibler's divergences for intensity distributions q and p of the first and second parts respectively.

12. The method of claim 1, wherein the image is an image of a brain having a left hemisphere and a right hemisphere, and wherein the step of determining a symmetry plane comprises determining a symmetry plane to divide the image into a first part comprising the left hemisphere and a second part comprising the right hemisphere.

* * * * *